(12) United States Patent
Hunka et al.

(10) Patent No.: US 10,893,602 B2
(45) Date of Patent: Jan. 12, 2021

(54) METHOD FOR PRODUCING A POWER ELECTRONICS SYSTEM

(71) Applicant: SEMIKRON ELEKTRONIK GMBH & CO. KG, Nuremberg (DE)

(72) Inventors: Thomas Hunka, Nuremberg (DE); Marco Lederer, Nuremberg (DE); Rainer Popp, Petersurach (DE); Stefan Weiss, Hoechstadt (DE); Patrick Sturm, Nuremberg (DE)

(73) Assignee: SEMIKRON ELEKTRONIK GMBH & CO. KG, Nuremberg (DE)

( * ) Notice: Subject to any disclaimer, the term of this patent is extended or adjusted under 35 U.S.C. 154(b) by 167 days.

(21) Appl. No.: 16/184,267

(22) Filed: Nov. 8, 2018

(65) Prior Publication Data

US 2019/0182945 A1 Jun. 13, 2019

(30) Foreign Application Priority Data

Dec. 13, 2017 (DE) .......................... 10 2017 129 707

(51) Int. Cl.
*H05K 1/02* (2006.01)
*H01R 12/51* (2011.01)
(Continued)

(52) U.S. Cl.
CPC ......... *H05K 1/0203* (2013.01); *H01R 12/515* (2013.01); *H05K 1/144* (2013.01);
(Continued)

(58) Field of Classification Search
CPC ...... H05K 1/0203; H05K 1/144; H05K 1/181; H05K 7/20854; H05K 7/209; H01R 12/515; Y10T 29/49126
See application file for complete search history.

(56) References Cited

U.S. PATENT DOCUMENTS

| 8,441,827 B2* | 5/2013 | Baker | H05K 7/20927 363/141 |
| 2016/0093589 A1* | 3/2016 | Sato | H01L 23/49838 257/690 |

FOREIGN PATENT DOCUMENTS

| DE | 10127947 | 10/2002 |
| EP | 3010040 A1 | 4/1916 |
| EP | 2395647 A1 | 12/2011 |

OTHER PUBLICATIONS

DE 10 2017 129 707.3, German Examination Report dated Dec. 5, 2018, 15 pages—German, 3 pages—English.

* cited by examiner

*Primary Examiner* — Livius R. Cazan
(74) *Attorney, Agent, or Firm* — Nolte Lackenbach Siegel; Andrew F. Young

(57) ABSTRACT

A method for producing a power electronics system having a cooling device, a switching device, a terminal device, a capacitor device and a control device includes the following production steps: providing a cooling device with a plurality of first and second positioning cutouts; providing the switching device with a substrate and a first mounting device, which has first positioning devices; providing the terminal device, which is completely independent of the switching device, i.e. forms a dedicated component part or a dedicated assembly, with a second mounting device, which has second positioning devices; arranging the switching device on the cooling device, wherein the first positioning devices are arranged in the respectively assigned first positioning cutouts; arranging the terminal device on the cooling device, wherein the respective second positioning devices are arranged in the assigned second positioning cutouts; arranging the capacitor device.

10 Claims, 5 Drawing Sheets

(51) Int. Cl.
  *H05K 3/36* (2006.01)
  *H05K 7/20* (2006.01)
  *H05K 1/14* (2006.01)
  *H05K 1/18* (2006.01)
  *H02K 11/33* (2016.01)
  *B62D 65/02* (2006.01)
  *H02K 5/22* (2006.01)

(52) U.S. Cl.
  CPC ............ *H05K 1/181* (2013.01); *H05K 3/368* (2013.01); *H05K 7/209* (2013.01); *H05K 7/20854* (2013.01); *B62D 65/02* (2013.01); *H02K 5/225* (2013.01); *H02K 11/33* (2016.01); *H05K 2201/042* (2013.01); *H05K 2201/066* (2013.01); *H05K 2201/10015* (2013.01); *H05K 2201/1031* (2013.01); *H05K 2201/10166* (2013.01); *H05K 2201/10522* (2013.01); *Y10T 29/49126* (2015.01)

METHOD FOR PRODUCING A POWER ELECTRONICS SYSTEM

CROSS REFERENCE TO RELATED APPLICATIONS

This application relates to, and claims priority from, DE Ser. No.: 10 2017 129 707.3 filed Dec. 13, 2017, the entire contents of which are incorporated herein by reference.

FIGURE SELECTED FOR PUBLICATION

FIG. 7.

BACKGROUND OF THE INVENTION

Field of the Invention

The present invention relates to a method for producing a power electronics system having a cooling device, a switching device, a terminal device, a capacitor device and a control device. This power electronics system is preferably intended for application in fully or partially electrically operated vehicles, in particular also in industrial trucks such as fork-lift trucks.

Description of the Related Art

The related art includes a circuit arrangement having a basic body, having at least one substrate having an intermediate circuit board, having a pressure device and having a driver circuit is known from the general prior art, for example as disclosed in DE 101 27 947 A1. The substrate has a positive-pole conductor track, a negative-pole conductor track, an AC conductor track and auxiliary terminals. Components such as power transistors are in contact with the conductor tracks and the auxiliary terminals. The intermediate circuit board has a positive-pole DC terminal and a negative-pole DC terminal and electrical capacitors connected between said DC terminals. An AC terminal element is assigned to the substrate. The positive-pole DC terminal and the negative-pole DC terminal have contact elements for making direct low-inductance contact with the associated conductor tracks on the at least one substrate. The same applies to the at least one AC terminal element. The pressure device is used for making electrical contact between the contact elements of the positive-pole DC terminal and the negative-pole DC terminal and the contact elements of the at least one AC terminal element.

Such built-on accessories are not readily amenable to modular manufacture, possibly with different configurations of the terminal elements given the same configuration of the switching device.

ASPECTS AND SUMMARY OF THE INVENTION

According to one aspect of the present invention, there is provided a method for producing a power electronics system having a cooling device, a switching device, a terminal device, a capacitor device and a control device includes the following production steps: providing a cooling device with a plurality of first and second positioning cutouts; providing the switching device with a substrate and a first mounting device, which has first positioning devices; providing the terminal device, which is completely independent of the switching device, i.e. forms a dedicated component part or a dedicated assembly, with a second mounting device, which has second positioning devices; arranging the switching device on the cooling device, wherein the first positioning devices are arranged in the respectively assigned first positioning cutouts; arranging the terminal device on the cooling device, wherein the respective second positioning devices are arranged in the assigned second positioning cutouts; arranging the capacitor device.

According to another aspect of the present invention, there is provided a method for producing a power electronics system having a cooling device, a switching device, a terminal device, a capacitor device and a control device which is readily amenable to modular production.

According to another alternative aspect of the present invention, there is provided a method according to the invention for producing a power electronics system having a cooling device, a switching device, a terminal device, a capacitor device, a control device and preferably a housing covering the switching device, the capacitor device and the control device has the following essential production steps:

a) providing a cooling device with a plurality of first and second positioning cutouts;
b) designing or providing the switching device with a substrate and a first mounting device, which has first positioning devices; in this case the positioning devices may be formed in one or more parts with the first mounting device;
c) providing the terminal device, which is completely independent of the switching device, i.e. forms a dedicated component part or a dedicated assembly, with a second mounting device, which has second positioning devices; in this case the positioning devices may be formed in one or more parts with the second mounting device;
d) arranging the switching device on the cooling device, wherein the first positioning devices are arranged in the respectively assigned first positioning cutouts;
e) arranging the terminal device on the cooling device, wherein the respective second positioning devices are arranged in the assigned second positioning cutouts;
f) arranging the capacitor device; and
g) arranging further components, in particular the control device.

Here, the following sequences for the order of the mentioned method steps are particularly advantageous:

step sequence: a) to g), wherein the sequence of steps b) and c) as well as d) and e) is in each case as desired, in particular b) and c) can also take place simultaneously since independent assemblies are involved.

step sequence: a) to e), wherein the sequence of steps b) and c) as well as d) and e) is in each case as desired, in particular b) and c) can also take place simultaneously, wherein step f) and possibly also step g) are performed together with step d).

Preferably, in production step b) the substrate can be arranged and fixed in a first cutout in the first mounting device, wherein the fixing is preferably performed by means of an adhesive, electrically insulating material.

It may be advantageous if the first mounting device of the switching device has a second cutout, which opens up a subarea of the substrate on the side remote from the cooling device.

It may likewise be preferred if the capacitor device has a contact element for making contact with the substrate of the switching device.

In principle, the further components can be selected from the following group: a control device, one or more internal electrical connecting elements, one or more internal load terminal elements, a housing. In this case, any desired combinations may be advantageous.

For production-related reasons, it may be particularly advantageous if the switching device or the control device form a structural unit with the capacitor device. In addition, the switching device or the control device with the capacitor device can be arranged relative to one another by means of third positioning cutouts and third positioning devices.

In principle, the positioning device of the respective mounting devices can be in the form of a pin or a screw. Corresponding to this, the respective positioning cutout can be in the form of a hole without an internal thread or in the form of a hole with an internal thread.

It is of course preferred if the terminal device has an external load terminal element. This external load terminal element can pass through the cooling device. Alternatively, the external load terminal element can protrude from the terminal device parallel or perpendicular to the cooling device and can preferably pass through a housing. The external load terminal element can in this case preferably be in the form of a bolt having a screw-type or plug-type connection for external feedlines.

Of course, if this is not explicitly or per se excluded or does not contradict the concept of the invention, the features mentioned in each case in the singular, in particular the variants of the terminal element, may be provided in the plural in the power electronics switching device according to the invention.

It goes without saying that the various configurations of the invention can be implemented individually or in any desired combinations in order to achieve improvements. In particular, the features mentioned and explained above and below can be used not only in the specified combinations, but also in other combinations or on their own without departing from the scope of the present invention.

The above and other aspects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
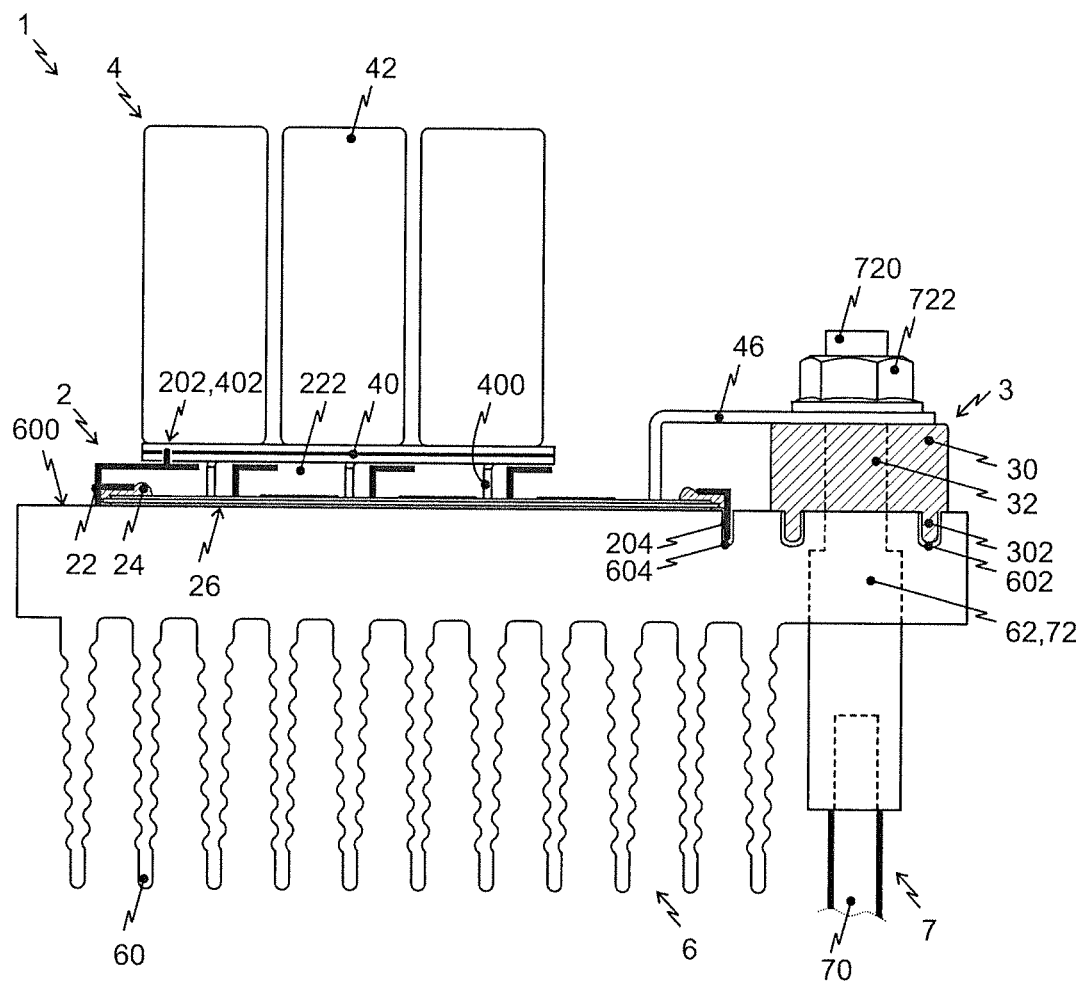
FIG. 1 shows a first configuration of a power electronics system produced using the method according to the invention.

Reference will now be made in detail to embodiments of the invention. Wherever possible, same or similar reference numerals are used in the drawings and the description to refer to the same or like parts or steps. The drawings are in simplified form and are not to precise scale. The word 'couple' or 'link' or 'connect' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

In the present text, numerous specific details are set forth in order to provide a thorough understanding of exemplary versions of the present invention. It will be apparent, however, to one skilled in the art, that some versions of the present invention may possibly be practiced without some of these specific details. Indeed, reference in this specification to "a variant," "variants," preference, and "one/the variant," or "one version" and the like, should be understood to mean that a particular feature, structure, or characteristic described in connection with the variant or version is included in at least one such variant or version according to the disclosure. Thus, the appearances of phrases such as "in one variant," "in one version," and the like, in various places in the specification are not necessarily all referring to the same version or variant, nor are separate or alternative versions or variants mutually exclusive of other versions or variants. Moreover, various features may be described which possibly may be exhibited by some variants or versions and not by others. Similarly, various requirements are described which may be requirements for some variants or versions, but not others. Furthermore, as used throughout this specification, the terms 'a', 'an', 'at least' do not denote a limitation of quantity, but rather denote the presence of at least one of the referenced item, in the sense that singular reference of an element does not necessarily exclude the plural reference of such elements. Concurrently, the term "a plurality" denotes the presence of more than one referenced items. Finally, the terms "connected" or "coupled" and related terms are used in an operational sense and are not necessarily limited to a direct connection or coupling.

Various operations may be described as multiple discrete operations in turn, in a manner that may be helpful in understanding embodiments of the present invention; however, the order of description should not be construed to imply that these operations are order dependent.

One of the non-limited present inventions is noted in FIG. 1 which shows a first configuration of a power electronics system 1 produced using the method according to the invention. Illustrated is a cooling device 6, in this case an air-cooled heat sink 60, which has a plurality of first positioning cutouts 604, of which only one is illustrated. This illustrated first positioning cutout 604 passes, starting from a first surface 600 of the cooling device 6, into said cooling device and is in the form of a hole, more precisely in the form of a blind hole without an internal thread. Furthermore, the cooling device 6 has two second positioning cutouts 602, which in principle have the same design as the first cutouts. Finally, the cooling device 6 has a through-cutout 62, which passes from the first surface to an opposite second surface.

Furthermore illustrated is a switching device 2, which has a first mounting device 22 and a substrate 26. The substrate 26 is a conventional substrate for power electronics applications and has conductor tracks populated with power semiconductor components on its first side remote from the cooling device. The power semiconductor components are connected up in the switching device 2 in a manner conventional in the art.

Figure 3:
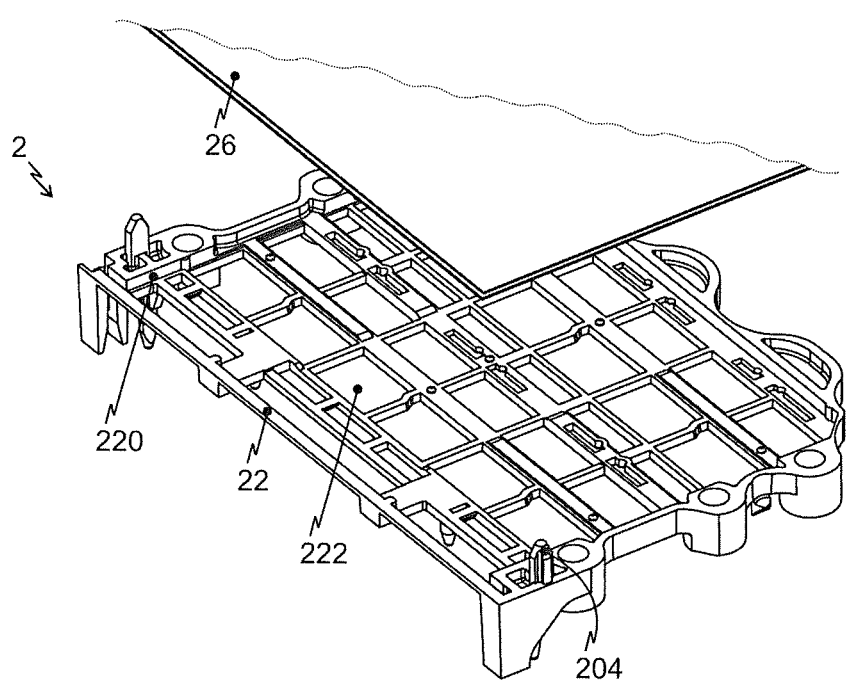
FIGS. 3 to 7 show assemblies and the arrangement thereof to form a third configuration in various stages of the method according to the invention.

The first mounting device 22 has a first cutout 220, cf. FIG. 3, for receiving the substrate 26. It is of course also possible for a plurality of first cutouts for respectively assigned substrates to be provided. The substrate 26 arranged in the first cutout 220 is fixed to the first mounting device 22 by means of an adhesive, electrically insulating material 24, as a result of which a first mounting unit 22 or a first assembly is produced. The first mounting device 22 furthermore has a second cutout 222, preferably a plurality of second cutouts 222, which each open up a subarea of the substrate 26 on the side remote from the cooling device 6. In this case, connecting devices 400 of further components or assemblies of the power electronics system 1 protrude through these second cutouts 222 in order to make contact with conductor tracks on the substrate 26, for example.

A capacitor device 4 is arranged on the first mounting device 22, wherein said mounting device and said capacitor device are positioned relative to one another by means of third positioning cutouts 402 and third positioning devices 202. The first mounting device 22 and the capacitor device 4 therefore form, together, a modified, to be more precise extended, first assembly of the power electronics system. The capacitor device 4 as such has a plurality of capacitors 42, a contact bus 40 and contact elements 400 for making electrical contact with the substrate 26.

Furthermore, the first mounting device 22 has first positioning devices 204, of which only one is illustrated. This first, pin-like positioning device 204 engages in the assigned positioning cutouts 604 in the cooling device 6 in order to fix the position of the switching device 2 relative to the cooling device 6.

A second assembly, which can be arranged independently of the first, is in principle formed by the terminal device 3, which in this case has a second mounting device 30 in the form of an insulating body. This second mounting device 30 has two second pin-like positioning devices 302, which engage in assigned second positioning cutouts 602 in the cooling device 6 for fixing the position of the terminal device 3 relative to the cooling device 6.

The second assembly in this case further comprises three internal load terminal elements 46, which are fastened, at least provisionally, on the second mounting device 30 and have a contact region for making electrical contact with in each case one conductor track on the substrate 26. The one internal load terminal element 46 illustrated here is intended for conducting one of three AC voltage potentials of the power electronics system 1.

The second mounting device 30 furthermore has a through-cutout 32, which is arranged so as to be aligned with respect to the through-cutout 62 in the cooling device. Part of an external load terminal element 7 protrudes through these two cutouts 32, 62 and through the internal load terminal element 46. The external load terminal element 7 has a feedline section 70 and a bolt-like end piece 72, which is electrically connected to the internal load terminal element 46 by means of a screw-type connection 720, 722 and is positionally fixed with respect to the terminal device 3.

Figure 2:
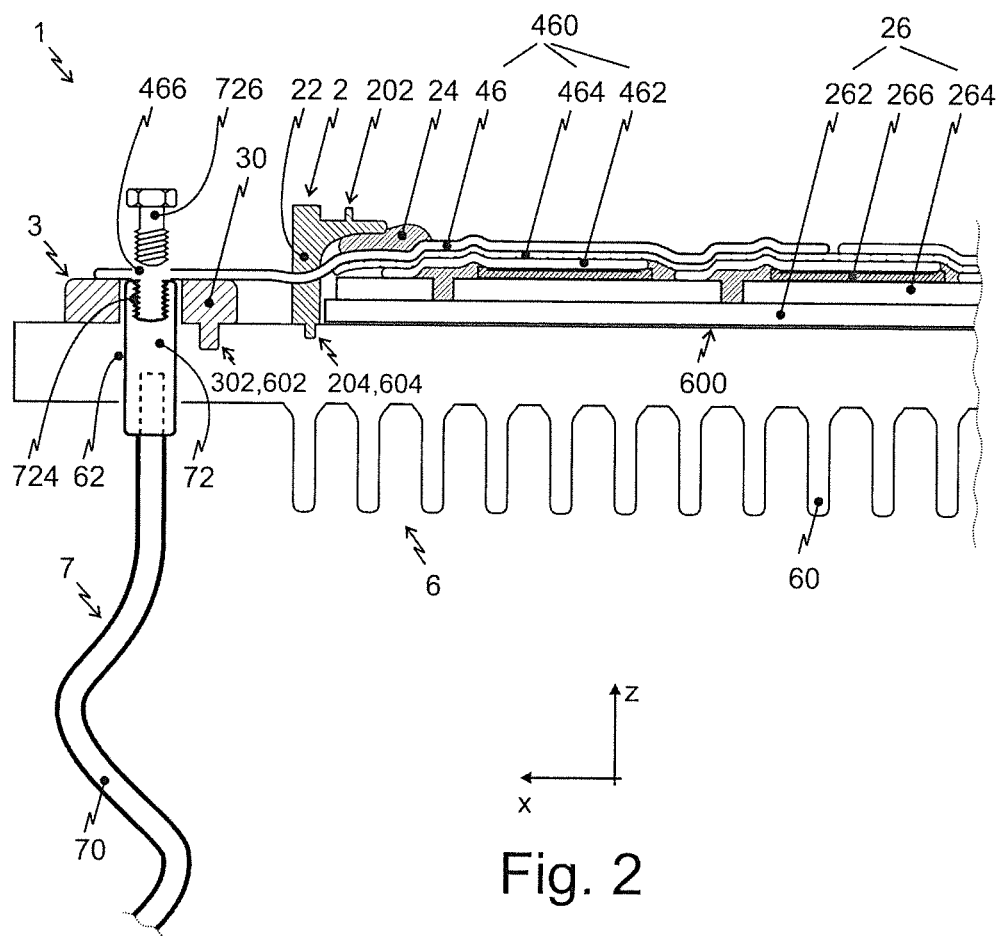
FIG. 2 shows a second configuration of a power electronics system produced using the method according to the invention.

FIG. 2 shows a second configuration of a power electronics system 1 produced using the method according to the invention. The cooling device 6 is in this case in principle designed to be the same as that in the first configuration and therefore has the functionally identical first and second positioning cutouts 602, 604.

The switching device 2 of this second configuration has a substrate 26 having an insulating body 262 and a plurality of conductor tracks 264. Power semiconductor components 266 are arranged on some of these conductor tracks 264. The internal circuit-appropriate connection of the switching device takes place by means of a stack of films 460 consisting of an insulating film 464 with electrically conductive films 46, 462 arranged on the respective surface thereof. One of these electrically conductive films at the same time forms an internal load terminal element 46.

The substrate 26 is surrounded by the first mounting device 22 and is fixed in said mounting device by means of an adhesive, electrically insulating material 24, as a result of which the switching device 2 is in the form of a first assembly. The first mounting device 22 has a further pin 202, which is used for positioning a capacitor device (not illustrated) relative to the switching device 2. The first positioning device 204 of the first mounting device 22, again a pin here, engages in the first positioning cutouts 604 and fixes the position of the switching device 2 relative to the cooling device 4.

Likewise and again illustrated as a second assembly is the terminal device 3 having the second mounting device 32, which in this case has a pin as second positioning device 302. Said pin engages in the second positioning cutouts 602 and fixes the position of the terminal device 3 relative to the cooling device 6.

Therefore, the two assemblies and also the two mounting devices are each positioned independently of one another relative to one another and to the cooling device.

The internal load terminal element 46, the second mounting device 30 and the cooling device 6 each have throughcutouts, which are each aligned with respect to one another and through which in this case a screw 726 passes at least partially, and an external load terminal element 7, which in this case is arranged both in the cutout 62 in the cooling device 6 and in the second mounting device 30. The external load terminal element 7 itself has a flexible feedline 70 and a bolt 72 having an internal thread 724 for the mentioned internal connection.

FIGS. 3 to 7 show assemblies of the power electronics switching device 1 and the arrangement thereof to form a third configuration in various stages of the method according to the invention.

FIG. 3 shows the switching device prior to assembly from the perspective of the cooling device, i.e. virtually from below, during method step b). Illustrated is a first mounting device 22 having a first cutout 220 for receiving the substrate 26, as well as having a multiplicity of second cutouts 222, by means of which a capacitor device, more precisely the contact elements thereof, can be brought into electrical contact with the substrate 26, in particular the conductor tracks thereof. Further illustrated are first positioning devices 204, which are in this case in the form of pins and are intended for arrangement in assigned first positioning cutouts 604 in a cooling device 6.

Figure 4:
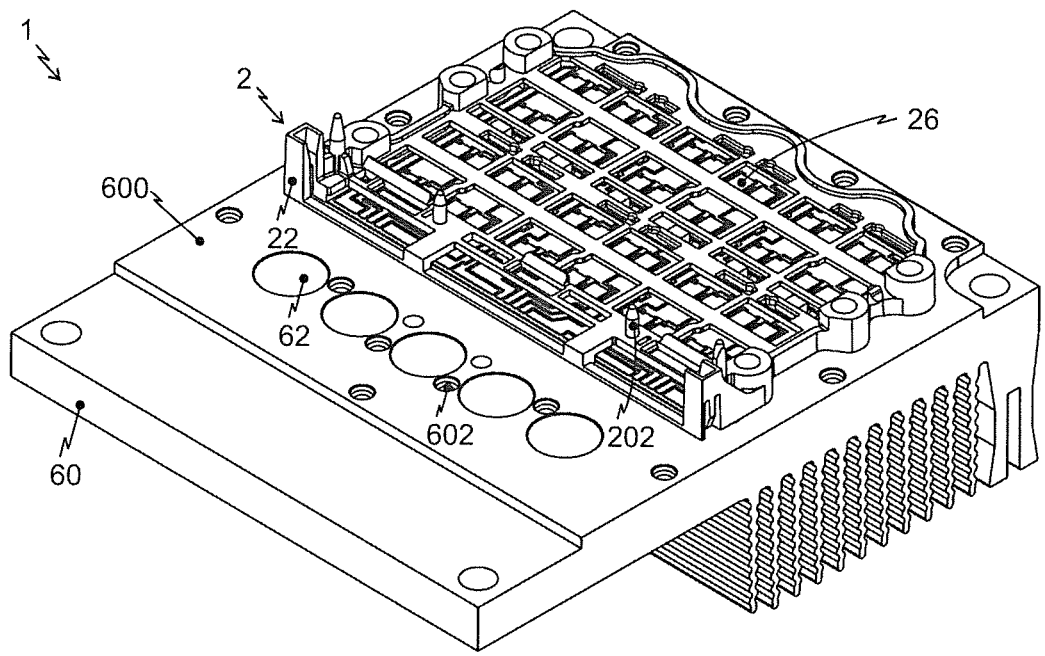

FIG. 4 shows the first surface of a cooling device, on which a circuit arrangement shown in FIG. 3 is arranged and is positioned by means of the interaction of the first positioning cutouts 604 in the cooling device and the first positioning devices 204 of the first mounting device 22. This corresponds to the end of method step d).

Further illustrated are through-cutouts 62 passing from the first surface to the second surface of the cooling device 6 for the arrangement of terminal elements, in particular external terminal elements. Illustrated directly adjacent to these cutouts 62 are second positioning cutouts 602, which are used for positioning the terminal device 3, more precisely the second mounting device 30. In this configuration of the cooling device 6, there are two configurations of positioning cutouts, namely those with and those without an internal thread. It is also possible for one of the cutouts 62 itself to act as positioning cutout by virtue of suitable positioning devices passing from the second mounting device 30 into said cutouts. Said cutouts can then be in the form of a cylinder jacket, wherein the terminal elements pass through this cylinder jacket.

Figure 5:
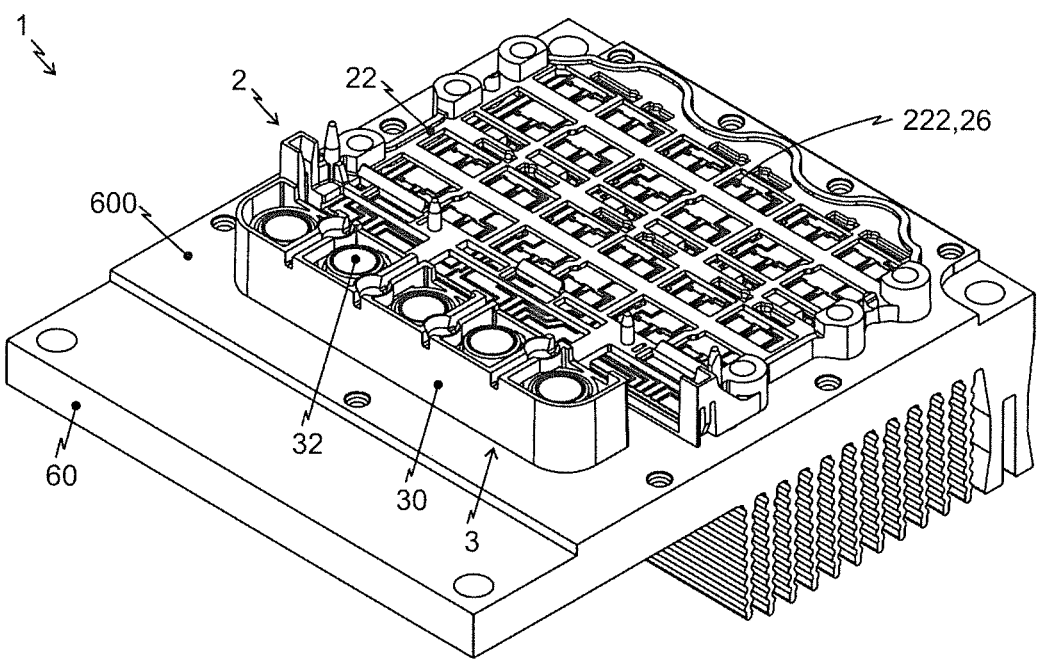

FIG. 5 shows the next step, in which a second assembly, namely the terminal device 3, is arranged after the first assembly, in this case the circuit arrangement 1. This corresponds to the end of method step e). The positioning of the second mounting device 30 of the terminal device 3 takes place as described above by virtue of positioning devices both in the form of a pin and also in the form of a screw engaging in the first positioning cutouts in the cooling device 6.

Figure 6:
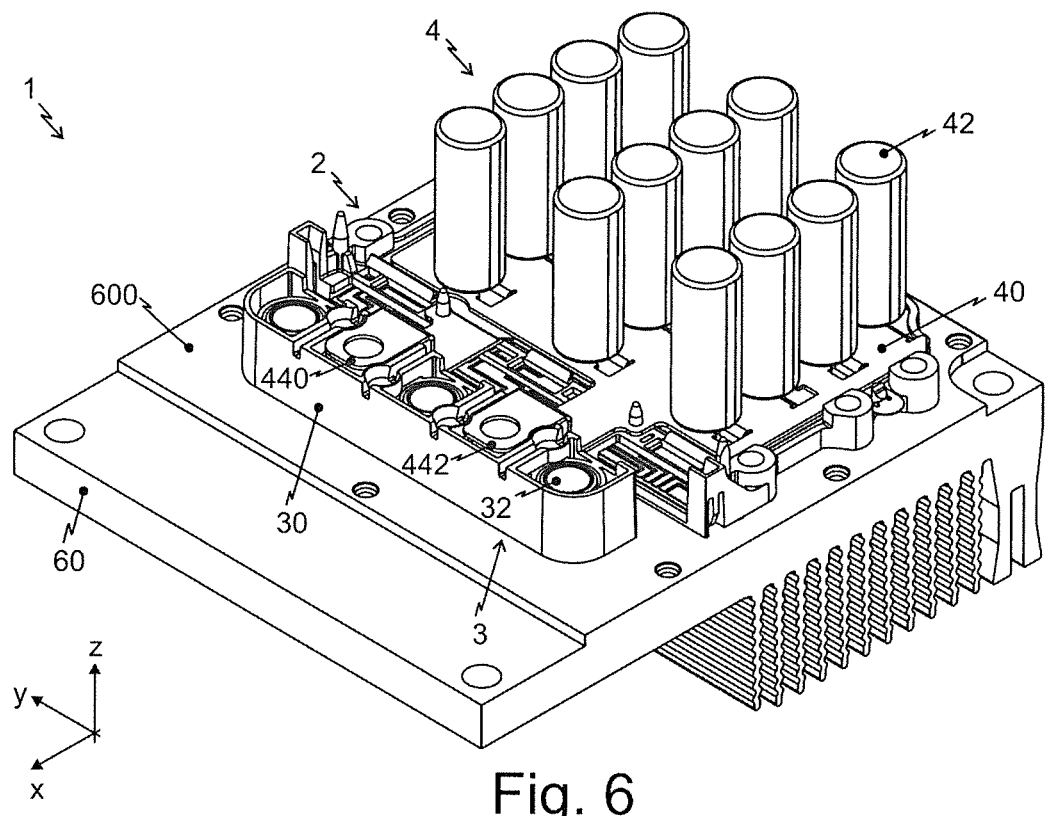

FIG. 6 shows a capacitor device 4, in this case in the form of a third assembly, arranged on the first mounting device 22 in accordance with method step f). The capacitor device 4 has a plurality of capacitors 42, a contact bus 40 having a plurality of contact elements 400 passing through second cutouts in the first mounting device 222 for making electrical contact with the substrate 26 as well as internal load terminal elements 440, 442, which are in this case formed integrally with the contact bus 40. These two internal load terminal elements 440, 442 come to lie on the second mounting device 30 and have cutouts which are each aligned with an assigned cutout 32 in the second mounting device 30. These two internal load terminal elements 440, 442 are used for supplying direct current to the capacitors 42.

Figure 7:
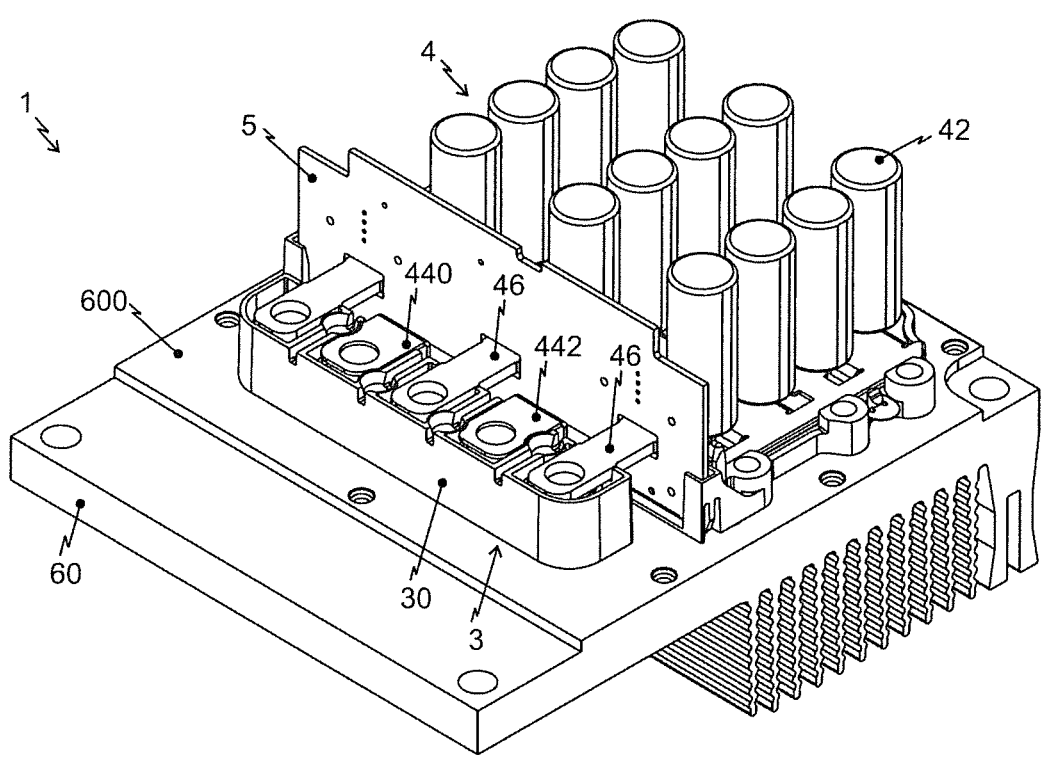

FIG. 7 shows the power electronics system 1 after arrangement of a control device 5 as well as the internal load terminal elements 46 for the three phases of the AC output voltage, i.e. in accordance with method step g). The power electronics system 1 can now by means of external load terminal elements (discussed but not illustrated), cf. FIGS. 1 and 2, with which external electrical contact is made through the cutouts 62 in the cooling device and the cutouts 32, aligned therewith, in the second mounting device 30. A conventional housing is not illustrated here but would be understood by one of skill in the art having reviewed and understood the present disclosure.

Purely for the avoidance of doubt, as described above, it is also possible for a screw to act as first or second positioning devices instead of a pin. Said positioning devices then interact with positioning cutouts, which are in the form of blind holes with an internal thread, wherein typically the positioning cutouts of pins do not have an internal thread.

Figure 8:
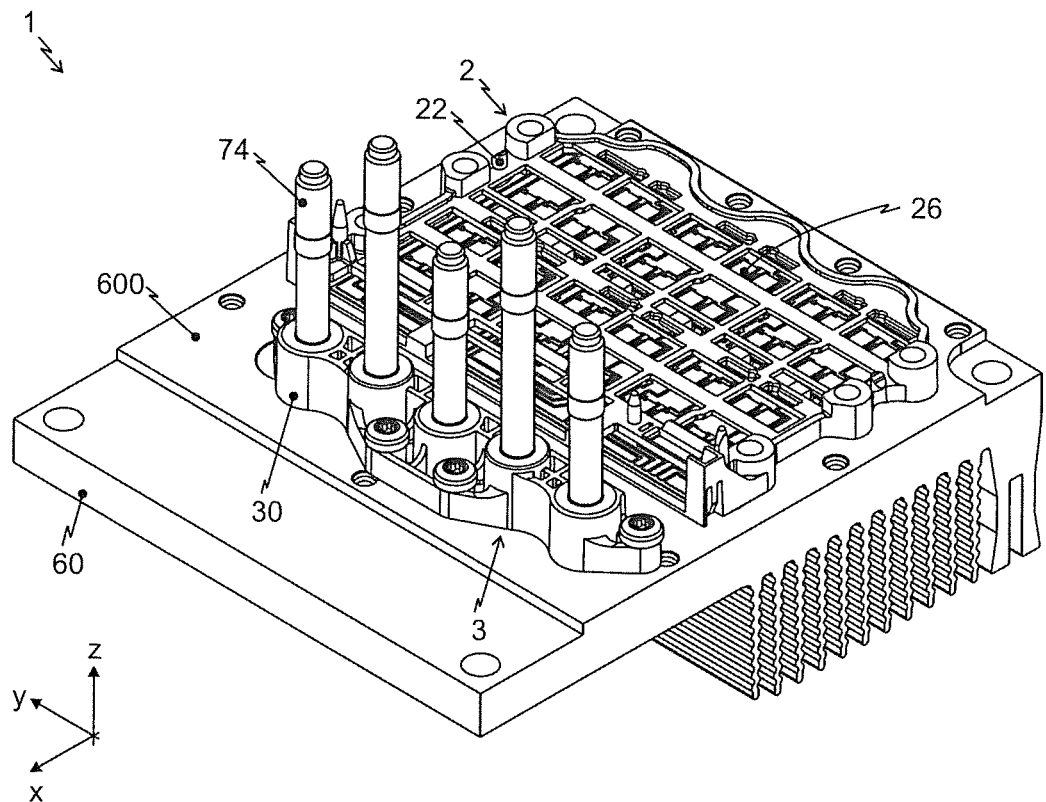
FIG. 8 shows an alternative configuration of the external load terminal elements in comparison with the configuration shown in FIG. 5.

FIG. 8 shows an alternative configuration of the external load terminal elements 74 in comparison with the configuration shown in FIG. 5. In this case, as the only difference from the previously described configuration, load terminal elements which do not protrude through cutouts in the cooling device, but are in the form of bolts which protrude outwards through a housing (not illustrated) are arranged in cutouts 32 in the second mounting device 30. The remaining components are identical to the above-described configuration shown in FIGS. 3 to 7.

Figure 9:
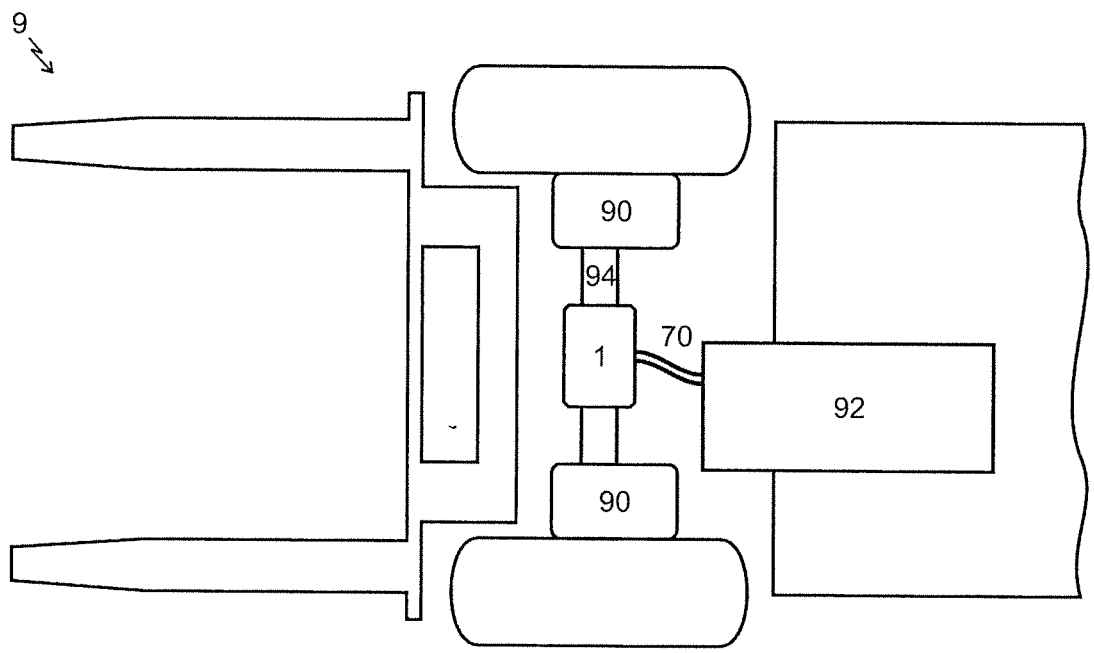
FIG. 9 shows an electrically operated vehicle having a power electronics system.

FIG. 9 shows, purely schematically, an electrically operated vehicle 9, in this case, without any restriction to generality, a fork-lift truck as a configuration of an industrial truck, having a power electronics system 1 produced in accordance with the invention. The power electronics system 1 is arranged on an axle 94 of the fork-lift truck 9 and is connected to two electric motors 90 arranged directly on the wheels. The supply of energy takes place by means of a battery 92, which is likewise connected to the power electronics system 1.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A method for producing a power electronics system having a cooling device, a switching device, a terminal device, a capacitor device and a control device, comprising the following production steps:
   a) providing a cooling device with a plurality of first positioning cutouts and a plurality of second positioning cutouts and said first positioning cutouts and the second positioning cutouts are on a first surface of the cooling device and said first surface is opposite a plurality of extending air-cooled heat sink members;
   b) providing the switching device with a substrate and a first mounting device, which has a plurality of first positioning devices, and wherein in the production step b) of providing, the substrate is arranged in a first cutout in the first mounting device, and further comprises conducting a step of fixing the substrate in the first cutout wherein the step of fixing is performed by means of an adhesive electrically insulating material;
   c) providing the terminal device with a second mounting device, which has a plurality of second positioning devices;
   d) arranging the switching device on the cooling device, wherein the first positioning devices are arranged in respectively assigned first positioning cutouts;
   e) arranging the terminal device on the cooling device, wherein the respective second positioning devices are arranged in the respectively assigned second positioning cutouts;
   f) positioning the capacitor device on said substrate and said switching device wherein said capacitor device includes a plurality of capacitors and a contact bus bar has a plurality of contact elements extending through second cutouts of the first mounting device for electrically contacting the substrate; and
   g) positioning a plurality of load connection elements, for conducting alternating voltage potential, attached to the second mounting device and each said load connection element having a contact area for making simultaneous electrical contact with a respective conductor track of the substrate; and
   wherein the first mounting device of the switching device has a second cutout, which opens up a bounded sub-area opening of the substrate on a side remote from the cooling device.

2. The method, according to claim 1, wherein:
   the capacitor device has a contact element for making contact with the substrate of the switching device.

3. The method, according to claim 1, wherein:
   at least one further component is selected from the group consisting of: a control device, one or more internal electrical connecting elements, one or more internal load terminal elements, and a housing.

4. The method, according to claim 1, wherein:
one of the switching device or the control device forms a structural unit with the capacitor device.

5. The method, according to claim 4, wherein:
said one of the switching device or the control device forming said structural unit with the capacitor device are arranged relative to one another by means of a plurality of third positioning cutouts and a plurality of third positioning devices.

6. The method according to claim 1, wherein:
the respective positioning devices of the respective first mounting device and the second mounting device is in the form of a pin or a screw.

7. The method, according to claim 1, wherein:
the respective positioning cutout is in the form of a hole without an internal thread or in the form of a hole with an internal thread.

8. The method, according to claim 1, wherein:
the terminal device has an external load terminal element.

9. The method, according to claim 8, wherein:
the external load terminal element passes through the cooling device.

10. The method, according to claim 8, wherein:
the external load terminal element protrudes from the terminal device parallel or perpendicular to the cooling device.

\* \* \* \* \*